United States Patent
Ma et al.

(10) Patent No.: US 6,714,454 B2
(45) Date of Patent: Mar. 30, 2004

(54) METHOD OF OPERATION OF A DUAL-BIT DOUBLE-POLYSILICON SOURCE-SIDE INJECTION FLASH EEPROM CELL

(76) Inventors: Yueh Yale Ma, 12471 Barley Hill, Los Altos Hills, CA (US) 94024; Chan-Sui Pang, 1078 Fuchsia Dr., Sunnyvale, CA (US) 94086

(*) Notice: Subject to any disclaimer, the term of this patent is extended or adjusted under 35 U.S.C. 154(b) by 0 days.

(21) Appl. No.: 10/280,722

(22) Filed: Oct. 24, 2002

(65) Prior Publication Data

US 2003/0057474 A1 Mar. 27, 2003

Related U.S. Application Data

(62) Division of application No. 09/467,141, filed on Dec. 10, 1999.

(51) Int. Cl.[7] .................................................. G11C 16/04
(52) U.S. Cl. ........................ 365/185.18; 365/185.03; 365/185.01
(58) Field of Search ..................... 365/185.18, 185.01, 365/185.03

(56) References Cited

U.S. PATENT DOCUMENTS

| | | | | |
|---|---|---|---|---|
| 6,204,126 | B1 | * | 3/2001 | Hsieh et al. ................. 438/267 |
| 6,339,006 | B1 | * | 1/2002 | Lee et el. ..................... 438/366 |
| 2001/0028577 | A1 | * | 10/2001 | Sung et al. ............. 365/185.18 |
| 2002/0063276 | A1 | * | 5/2002 | Tsukiji ......................... 257/316 |
| 2002/0137286 | A1 | * | 9/2002 | Gonzalez et al. ........... 438/257 |

* cited by examiner

Primary Examiner—Huan Hoang
(74) Attorney, Agent, or Firm—Townsend and Townsend and Crew LLP (57) ABSTRACT

A four-terminal dual-bit double polysilicon source-side injection flash EEPROM cell, capable of storing two bits of information includes a right junction (which can serve as a cell drain or a source), a left junction (which can serve as a cell source or drain), a select-gate, and two floating gates. The two floating gates are insulated from the select-gate by an inter gate dielectric. The inter-gate dielectric has a "weak region" so that during erase mode electrons can tunnel from the floating gate to the select-gate. The two bits in the cell are to be separately read or programmed, but are to be erased simultaneously. Programming of each bit is achieved through hot-carrier injection, while simultaneous erase of the two bits is achieved through electron tunneling.

16 Claims, 6 Drawing Sheets

METHOD OF OPERATION OF A DUAL-BIT DOUBLE-POLYSILICON SOURCE-SIDE INJECTION FLASH EEPROM CELL

CROSS-REFERENCE TO RELATED APPLICATIONS

This application is a divisional of U.S. application Ser. No. 09/467,141, filed Dec. 10, 1999, and entitled "Dual-Bit Double-Polysilicon Source-Side Injection Flash EEPROM Cell", which disclosure is incorporated herein by reference.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

1. Field of the Invention

This invention relates to semiconductor nonvolatile memory devices, and more particularly to a dual bit source side injection cell which has two floating gates for storing two bits of information.

2. Description of the Related Art

There are two types of hot-electron injection flash EEPROM cells, classified by the location of the charge injection in the programming mode. They are commonly referred to as "drain-side" and "source-side" injection cells. In a drain-side injection cell, electrons are injected onto the floating gate from a region in the source-drain channel near the drain junction; while in a source-side injection cell, electrons are injected onto the floating gate from a region in the source-drain channel near the source junction.

Source-side injection cell has superior programming characteristics because it requires substantially lower programming current than the drainside injection cell. Therefore, source-side injection cells are more suitable for low power and low voltage applications.

Figure 1A:
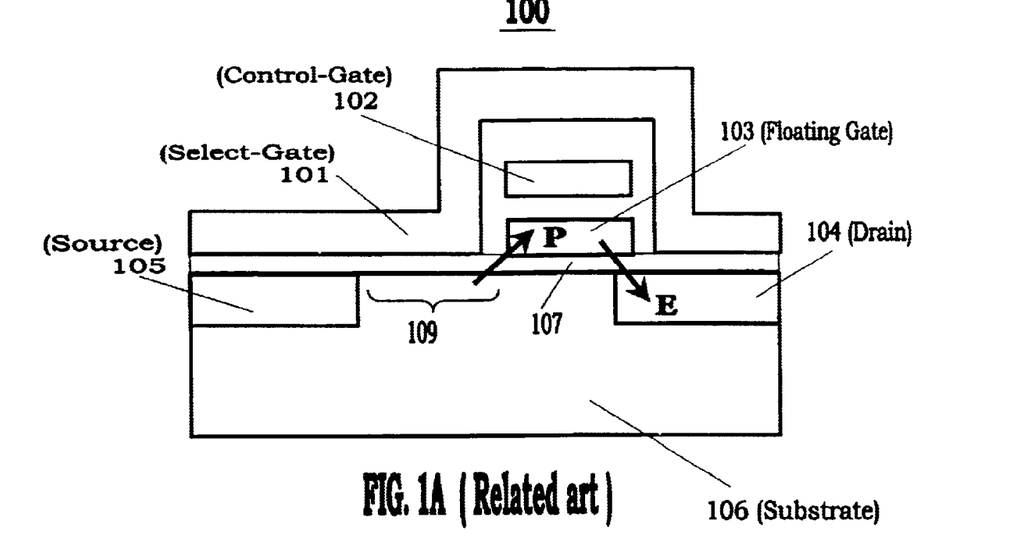
FIGS. 1A and 1B are cross-section views of two single-bit, source-side injection flash EEPROM cells known in the art.
Figure 1B:
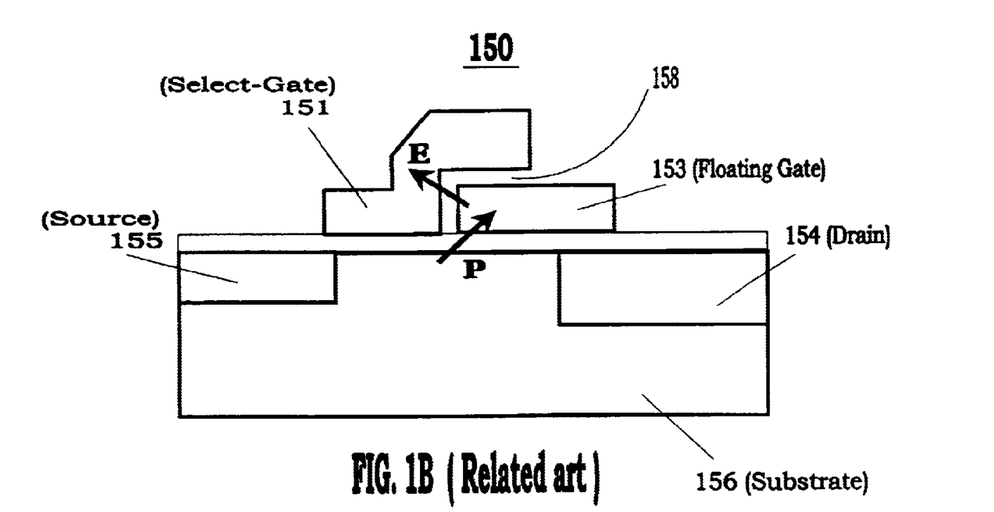

FIGS. 1A and 1B are cross-section views of two types of source-side injection cells. FIG. 1A shows a triple-polysilicon source-side injection cell 100 disclosed in the U.S. Pat. No. 5,280,446 by Ma et al., incorporated herein by reference. FIG. 1B shows a double-polysilicon cell 150 disclosed in U.S. Pat. No. 5,029,130 by Yeh, incorporated herein by reference. A common feature of the cell structures 100 and 150 is that the channel between the source and drain junctions is covered partly by a floating gate and partly by a select-gate. Such structures are commonly referred to as a split-gate structure.

A structural difference between cells 100 and 150 is that the triple-polysilicon cell 100 has five operating terminals (select-gate 101, control-gate 102, drain 104, source 105, and substrate 106), while the double-polysilicon cell 150 has four operating terminals (select-gate 151, drain 154, source 155, and substrate 156). Note that drain junction 154 is deeper than source junction 155 to increase floating gate 153 to drain 154 overlap capacitance for improved voltage coupling from the drain to the floating gate. Cell 100 has a channel portion 109.

While the programming mechanisms of cell structures 100 and 150 are similar (e.g., source-side injection, shown by the arrows P in FIGS. 1A and 1B), their erase operations differ. In the triple-polysilicon cell 100, during erase, the electrons are tunneled from floating gate 103 to drain 104 via a thin gate-dielectric 107. This is shown by the arrow E in FIG. 1A. However, in the double-polysilicon cell 150, the electrons are tunneled from floating gate 153 to select-gate 151 via a thin inter-polysilicon dielectric 158 at a pointed corner of floating gate 153. This is shown by the arrow E in FIG. 1B.

The manufacturing process for the double-polysilicon cell 150 is less costly and has a shorter fabrication cycle time than the triple-polysilicon cell 100, because cell 150 requires one less polysilicon layer and thus fewer masking steps. However, the process development associated with the special sharp tip of the floating gate 153 and the delicate inter-polysilicon dielectric 153 of cell 150 is quite tedious.

An important factor that directly impacts the cell-size and the array-size is the choice of array architecture. In conventional arrays, one bit-line contact is normally required for every two cells. In such "direct contact" arrays, the bit-line contact occupies a substantial portion of the cell area. In an alternative "virtual ground" (or so-called "contactless") array approach, the number of contacts per cell is greatly reduced (typically by a factor of about 10×), hence resulting in smaller cell-size and smaller array-size. However, because of its inherently high bit-line resistance, the virtual-ground array suffers from slower memory access speed.

Figure 2:
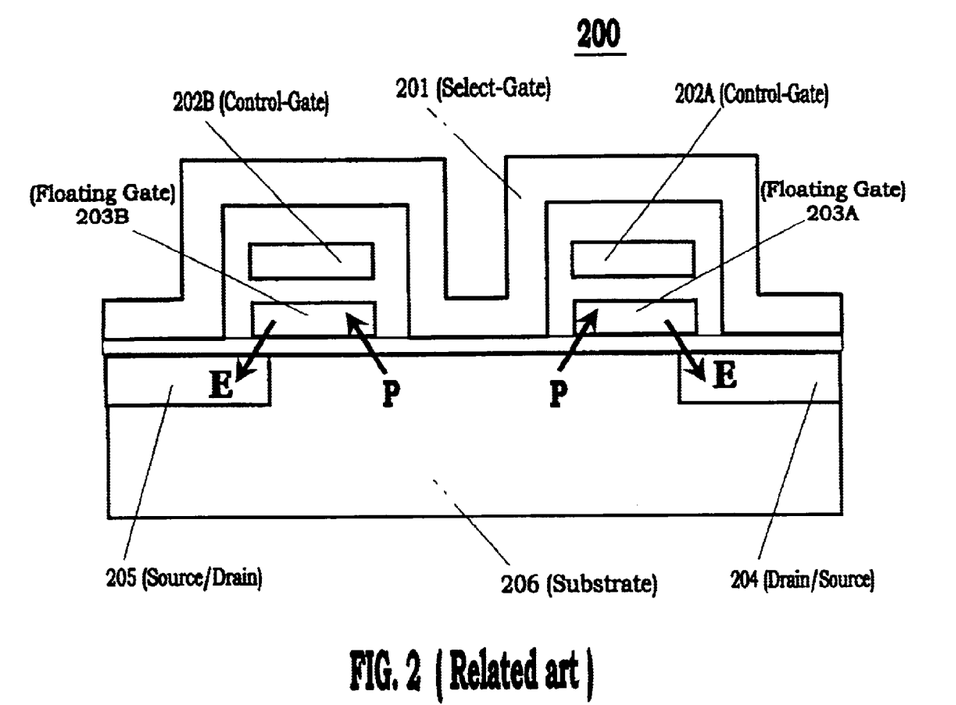
FIG. 2 is a cross-section view of a six-terminal dual-bit triple-polysilicon source-side injection flash EEPROM cell structure known in the art.

Memory cells 100 and 150 are single-bit cells (i.e., there is one floating gate in each cell for storing one bit of information). FIG. 2 is a cross-sectional view of a dual-bit triple-polysilicon cell structure 200 disclosed in U.S. Pat. No. 5,278,439 by Ma et al., incorporated herein by reference. Cell structure 200 is a six-terminal cell (select-gate 201, control-gates 202A and 202B, "drain/source" junctions 204 and 205, and substrate 206) with two floating gates 203A and 203B. Each floating gate 203A, 203B stores one bit of information. Structurally, cell 200 is obtained by merging two adjacent mirror-facing single-bit cells of the kind in FIG. 1A so that the source junctions (i.e., source junction 105 in FIG. 1A) and a select-gate portion (corresponding to channel portion 109 in FIG. 1A) of the merged cells are eliminated. This results in a smaller cell-size per bit. Junctions 204 and 205 are interchangeable in their functions (as a source or a drain) depending on whether the right bit (e.g., information stored in floating gate 203A) or the left bit (e.g., information stored in floating gate 2033) is accessed. Control-gates 202A and 202B are reciprocally identical.

A drawback of cell 200 is that it has a longer effective channel-length than the single-bit cell 100. This results in higher channel resistance and thus a lower read-current in the cell. The lower read-current generally results in slower memory access time. Thus, the small cell-size and lower read-current of cell 200 makes this cell suitable for high density memory applications which generally have less stringent memory access time requirements With memory density and the access speed as the criteria, flash memory applications are generally divided into two conmodity categories: (1) for code storage applications in which data access speed has greater importance than memory density, and (2) for mass-storage (or data storage) applications in which memory density has much greater importance than the access speed. Despite the small size of the dual-bit cell 200, its costly triple-polysilicon manufacturing process and complicated six-terminal operations, make it an unattractive option for the cost sensitive high density applications.

The NAND-type flash memory cell approach has become popular for mass-storage applications because of its small cell-size and its relatively simple double-polysilicon process. However, because its operation requires high voltage in both positive and negative polarities, designing the array decoders to fit within the tight cell-pitch limits future advancement of this technology. Also, because of its small read-current, the NAND-type array is more susceptible to noise immunity and suffers from slow sensing speed, and thus presents a greater challenge in achieving the target operation margins as technology scaling continues.

Thus, a new dual-bit cell with a comparable per bit cell-size to that of the NAND-type array but with higher read-current and fewer operating terminals, and which requires a simple process is needed for such applications as mass-storage.

SUMMARY OF THE INVENTION

In accordance with the present invention, a double-polysilicon cell structure is capable of storing two bits of information. In one embodiment, the cell structure includes a first junction and a second junction separated by a channel region, the first and second junctions being in a body region. A first and a second floating gates extend over the channel region. A select-gate has a portion located between the two floating gates, and the select-gate extends over at least a portion of each of the two floating gates.

In another embodiment, the first floating gate extends over a first portion of the channel region and over a portion of the first junction, and the second floating gate extends over a second portion of the channel region and over a portion of the second junction In another embodiment, each of the first and second floating gates has at least one slanted surface forming a sharp edge.

In another embodiment, an inter-polysilicon dielectric layer insulating the first and second floating gates from the select-gate is thinnest between the sharp edge of each of the two floating gates and the select-gate.

In another embodiment, the portion of the select-gate between the two floating gates extends over a third portion of the channel region between the first and second channel portions, wherein the first, second, and third portions of the channel region do not overlap with one another, and the first, second, and third channel portions together form the entire channel region between the first and second junctions.

In another embodiment by applying a first positive voltage to the first junction and a second positive voltage to the select-gate and grounding the second junction and the body region a potential on the first floating gate is decreased through hot-carrier injection mechanism.

In another embodiment, by applying a positive voltage to the select-gate and grounding the first junction, the second junction, and the body region a potential of the first floating gate and a potential of the second floating gate are simultaneously increased through tunneling mechanism.

In another embodiment, the amount of charge on the first floating gate is detected by applying a first positive voltage to the select-gate, a second positive voltage to the second junction and grounding the first junction and the body region In another embodiment, the amount of charge on the first floating gate is detected by applying a first positive voltage to the select-gate, a second positive voltage to the second junction, a third positive voltage to the first junction, and grounding the body region, wherein the second positive voltage is greater than the third positive voltage.

In another embodiment, the amount of charge on the first floating gate is detected by applying a first positive voltage to the select-gate, a second positive voltage to the second junction, and measuring the voltage at the first junction while forcing a predetermined amount of current through the channel region.

In another embodiment, the body region is a first well of a first conductivity type, the first well being formed in a second well of a second conductivity type opposite the first conductivity type, the second well being formed in a substrate region of the first conductivity type, wherein the first and second junctions are of the second conductivity type. The first well is capable of being independently biased to a predetermined positive or negative or zero voltage.

In another embodiment, the at least one slanted surface of each of the first and second floating gates is either a side surface or a top surface of each of the first and second floating gates.

In another embodiment, two opposing side surfaces of each of the two floating gates are slanted forming two sharp edges.

In another embodiment, a top surface of each of the first and second floating gates is bowl-shaped forming two sharp edges.

In another embodiment, two opposing side surfaces of each of the two floating gates are slanted and a top surface of each of the two floating gates is bowl-shaped, the combination of the two slanted side surfaces and the bowl-shaped top surface forming two sharp edges.

In another embodiment, the cell structure in combination with other similar cell structures forms a virtual ground array, wherein the cells are serially connected along a plurality of rows and columns. The select-gates of the cells along each row are connected together forming a wordline. The first junctions of cells along each column are connected together forming a continuous bitline, and the second junctions of the cells along each column are connected together forming another continuous bitline.

In accordance with another embodiment of the present invention, a method of forming the memory cell includes: forming a first junction and a second junction in a body region, the first and second junctions being separated by a channel region; forming a first floating gate and a second floating gate over the channel region, each of the first and second floating gates having at least one slanted surface forming a sharp edge; and forming a select-gate over at least a portion of each of the first and second floating gates, the select-gate having a portion between the first and second floating gates.

In another embodiment, the method includes: forming an inter-polysilicon dielectric layer for insulating the first and second floating gates from the select-gate, the inter-polysilicon dielectric layer being thinnest between the sharp edge of each of the two floating gates and the select-gate; forming an insulating layer for insulating the first and second floating gates from their underlying channel regions; and forming an insulating layer for insulating the select-gate from its underlying channel region.

Other features and advantages of the invention are described below. The invention is defined by the appended claims.

BRIEF DESCRIPTION OF THE DRAWINGS

The present invention may be better understood, and its numerous objects, features, and advantages made apparent to those skilled in the art by referencing the accompanying drawings.

The use of the same reference symbols in the drawings indicates similar or identical items. The drawings are merely illustrative, and do not represent the actual scale or proportions.

DETAILED DESCRIPTION OF THE INVENTION

In accordance with the present invention, a double-polysilicon dual-bit cell structure includes two symmetrical floating gates for storing two bits of information. The two floating gates are horizontally separated by a portion of a select-gate. The two floating gates are insulated from the select-gate by an inter-gate dielectric. The inter-gate dielectric is generally thick (to achieve a relatively small capacitance between the floating gates and the select-gate), but has a "weak region" so that during erase-mode electrons can tunnel from the floating gate to the select-gate. The cell also includes a conduction channel beneath and insulated from the two floating gates and the intermediate select-gate portion. The channel is bounded by a pair of source/drain junctions formed in a cell body region. As described below, this is a four-terminal cell.

Figure 3:
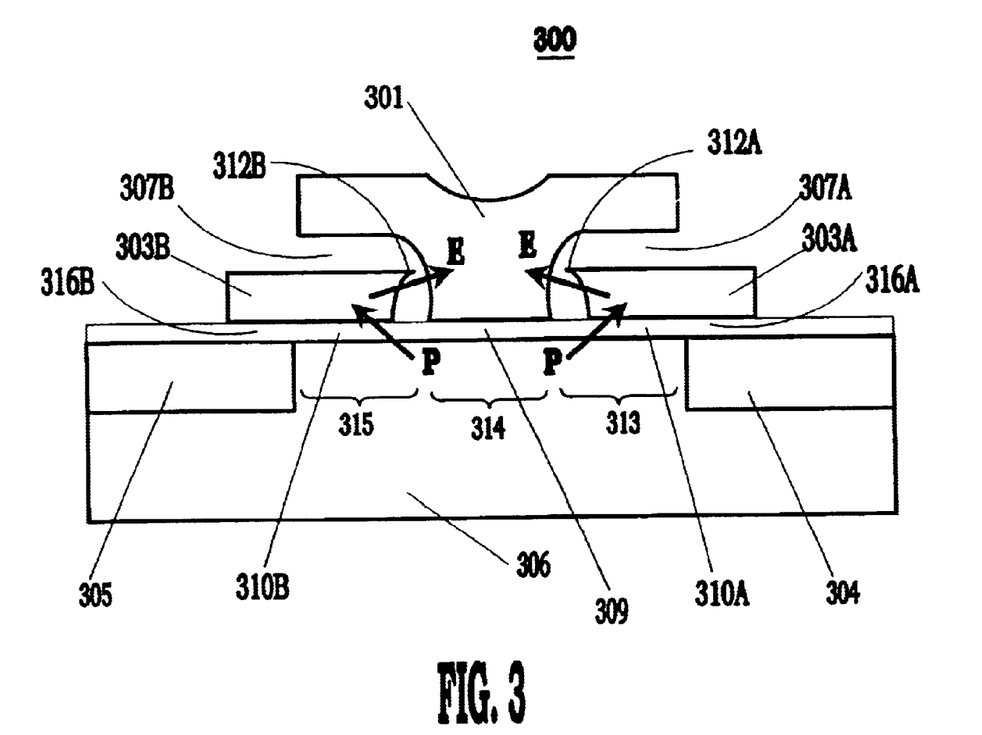
FIG. 3 is a cross-section view of a four-terminal dual-bit double-polysilicon flash EEPROM cell structure in accordance with one embodiment of the present invention.

FIG. 3 shows a cross-section view of a dual-bit flash EEPROM cell structure 300 in accordance with one embodiment of the present invention. Cell structure 300 includes a select-gate 301 extending over at least a portion of two adjacent floating gates 303A and 303B, and having a main select-gate portion between the right and left floating gates 303A and 303B. Floating gates 303A and 303B respectively have sharp edges 312A and 312B, and are mirror images of one another. Inter-polysilicon dielectric layers 307A and 307B insulate select-gate 301 from floating gates 303A and 303B, respectively. Inter-polysilicon dielectric 307A, 307B is generally thick, however, for effective electron tunneling between floating gates 303A, 303B and select-gate 301, dielectric 307A, 307B is the thinnest between select-gate 301 and the floating gates' sharp edges 312A, 312B.

Cell structure 300 further includes a right junction 304, a left junction 305, and a channel region therebetween. As will be shown below, junctions 304 and 305 serve, interchangeably, as the cell's drain and source terminals. The channel region is divided into three sections 313, 314, and 315 which are under right floating gate 303A, the middle portion of select-gate 301, and left floating gate 303B, respectively. Junctions 304 and 305 are structurally identical and are n-type doped in a p-type semiconductor body region 306. Floating gates 303A and 303B respectively overlap a large portion of junctions 304 and 305, thus forming overlap capacitors 316A and 316B. Overlap capacitors 316A and 316B serve as coupling capacitors for coupling the voltages at junctions 304 and 305 to the respective floating gates. Larger coupling capacitors enable application of smaller biasing voltages to junctions 304 and 305 during erase, programming and read operations.

Gate-oxide layer 310A separates floating gate 303A from the underlying right junction 304 and channel section 313. Similarly, gate-oxide layer 310B (which is identical to gate-oxide 310A) separates floating gate 303B from the underlying left junction 305 and channel section 315. Gate-oxide 309 separates the middle portion of select-gate 301 from channel mid-section 314. Oxide layer 309 may have a thickness different from or similar to oxide layers 310A, 310B.

One bit of information can be stored in each of the floating gates 303A and 303B. Hereinafter, "the right bit" and "the left bit" refer to the right half of the cell (which includes floating gate 303A) and the left half of the cell (which includes floating gate 303B), respectively. The portion of select-gate 301 over channel section 314 forms the select transistor portion of cell 300 which is shared by the right and left bits. The channel conduction in the channel mid-section 314 is controlled solely by the voltage applied to select-gate 301. Channel conduction in each of channel sections 313 and 315 is controlled by the resulting electrical potential of floating gates 303A and 303B, respectively. In operation, the electrical potential of each of floating gates 303A, 303B is determined by: (1) the amount of stored charges on the respective floating gates, and (2) the voltage applied to junctions 304 and 305 which couples to the corresponding floating gate through the overlap capacitors 316A and 316B.

The floating gates 303A, 303B are made of first layer polysilicon, and select-gate 301 is made of second-layer polysilicon (or silicide, or other metallic gate materials). Cell structure 300 has four terminals, namely, right junction 304, select-gate 301, left junction 305, and body 306. The cell's programming, read, and erase operations are carried out by applying proper voltages for specific durations to these four active terminals. As will be made more clear below, the body terminal of the cell may be the starting substrate or an internal well.

In erase-mode, as an example, a high-voltage (of about 12V) is applied to select-gate 301, while junctions 304 and 305, and body 306 are held at ground potential. The resultant electrical stress causes electrons to tunnel from floating gates 303A, 303B to select-gate 301. This is shown by arrows denoted as E in FIG. 3. The tunneling takes place at pointed edges 312A, 312B of the floating gates. In each cell erase operation, both bits of information stored in cell 300 are erased at the same time. After erase, floating gates 303A, 303B hold positive charges which increase the effective floating gate potential, thus making channel sections 313, 315 highly conductive. The state of both bits of cell 300 is thus set to the logic state of "one".

In programming mode, only one of the two bits can be programmed in a programming cycle. To program the right bit, right junction 304 (which serves as the cell's drain terminal) is biased to a high voltage (e.g., about 6.5V), select-gate 301 is biased to a low voltage (e.g., about 1.5V), while left junction 305 (which serves as the cell's source terminal) and body 306 are held at ground potential. Hot-electrons are thus generated in the channel region at the transition point between channel sections 314 and 313. A vertical electric field, set up by the right junction 304 voltage (drain voltage in this case), causes a certain portion of the generated hot-electrons to be injected onto the left-end (source-side in this case) of floating gate 303A. This is shown by the right pointing arrow P in FIG. 3. The electrical potential of floating gate 303A is thus reduced. As a result, channel section 313 becomes much less conductive, and the logic state of the right bit is thus changed from "one" to "zero". Because the programming action is of source-side injection nature, only a very small channel current, in the order of micro-ampere, is required.

The left bit is programmed in a similar but reciprocal manner to the right bit. Left junction 305 (which now serves as the cell's drain terminal) is biased to high voltage (e.g., about 6.5V), select-gate 301 is biased to a small voltage (e.g., about 1.5V), while right junction 304 (which now serves as the cell's source terminal) and body 306 are held at ground potential. Hot electrons are thus generated in the channel region at a transition point between channel sections 314 and 315. A vertical field, setup by the left junction 305 voltage (drain voltage in this case), causes a certain portion of the generated hot electrons to be injected onto the right end (source side in this case) of floating gate 303B. This is shown by the left pointing arrow P in FIG. 3. As a result, channel section 315 becomes much less conductive, and thus the logic state of the left bit is changed from "one" to "zero". Note that the current flow in programming the left bit is opposite that in programming the right bit because of the interchangeability of junctions 304 and 305 as the cell's drain and source terminals.

In the programmed and erased states, the floating gate stores a finite but different amounts of positive-charges (or holes) so that the device is to operate in depletion mode at all times. This makes the data retention more superior to the conventional negative-charges (electrons) storage devices due to the barrier height difference between electrons and holes at the interface of the floating gate and its surrounding oxide.

In read-mode, only one of the two bits of cell 300 is to be sensed in each read cycle. In principle, a cell's channel current, under properly biased conditions, reflects the amount of charge stored on a corresponding floating gate. The magnitude of the channel current is weighted by a sense amplifier to detect the logic state of the cell. To read the right bit, the charge storage status of floating gate 303A, which dictates the conduction ability of channel section 313, needs to be detected. About 2.5V is applied to left junction 305 and about 3V (or Vcc) is applied to select-gate 301, while right junction 304 and body 306 are held at ground potential. Under these biasing conditions, if the channel current is relatively large, a logic state of "one" is sensed, and if the channel current is relatively small, a logic state of "zero" is sensed. Note that depending on the sense amplifier's capability and design, cell 300 may be used to store multi-level logic states.

Note that in sensing the logic state of an unprogrammed floating gate 303A (the right bit), the amount of charges stored on a programmed floating gate 303B (the left bit) can influence the channel current. This is because of the serial channel effect of the dual-bit cell's three-section channel. As the left bit is programmed, channel section 315 becomes less conductive, which tends to reduce the channel current. However, the 2.5V applied to left junction 305 during read couples favorably onto floating gate 303B to make channel section 315 more conductive so that the logic state of the right bit is reflected dominantly by the conduction ability of channel section 313. Note that if floating gate 303B is programmed too strongly, then the channel current would be cut off despite the coupling from the 2.5V at left junction 305. Accordingly, maintaining the stored charges of a neighboring programmed bit within an optimum charge range is one of the key principles of properly operating the four-terminal dual-bit double-polysilicon cell 300.

The left bit is read in a similar but reciprocal manner to the right bit by applying about 2.5V to right junction 304 and about 3V (or Vcc) to select-gate 301, while left junction 305 and body 306 are held at ground potential. Under these biasing conditions, the magnitude of the channel current (which is dictated by the conduction ability of channel section 315) is weighted by the sense amplifier to determine the logic state of the left bit. Note that for each of the two bits, the direction of channel current flow during read is opposite that during programming.

Tables 1 and 2 below show the cell's biasing conditions for erase, program, and read of the right bit and the left bit, respectively.

TABLE 1

Right Bit Operating Conditions

|  | Left junction 305 (Source) | Select-Gate | Right junction 304 (Drain) | Body |
| --- | --- | --- | --- | --- |
| ERASE | 0 | 12 V | 0 | 0 |
| PROGRAM | 0 | 1.5 V | 6.5 V | 0 |
| READ | 2.5 V | 3 V | 0 | 0 |

TABLE 2

Left Bit Operating Conditions

|  | Left junction 305 (Drain) | Select-Gate | Right junction 304 (Drain) | Body |
| --- | --- | --- | --- | --- |
| ERASE | 0 | 12 V | 0 | 0 |
| PROGRAM | 6.5 V | 1.5 V | 0 | 0 |
| READ | 0 | 3 V | 2.5 V | 0 |

As Tables 1 and 2 illustrate, the cell's three operations are in fact the same for the right and the left bits, even though the biasing of junctions 304 and 305 appear reversed. This is because junctions 304 and 305 are interchangeable in their functions (as a source or a drain) depending on whether the right bit (e.g., information stored in floating gate 303A) or the left bit (e.g., information stored in floating gate 303B) is accessed. The voltages indicted in Tables 1 and 2 are illustrative only and are not intended to be limiting. These voltages may be used for a cell constructed in a 0.35 µm technology.

Unlike the single bit cell, performance of the dual-bit cell 300 must be presented in a four-corner matrix in order to cover all the possible logic states of the neighboring bit within cell 300. Table 3 below depicts the read case for the right bit.

TABLE 3

Read Current of Right-bit

| Left-bit Possible States: | "0" | "1" | "0" | "1" |
|---|---|---|---|---|
| Right-bit Read Current: | 7 µA | 7 µA | 46 µA | 53 µA |
| When State of Right-bit is: | "0" | | "1" | |

Two read current entries are provided for each of the "0" and "1" states of the right bit. Each read current entry corresponds to either a "0" or a "1" state of the neighboring left bit. Table 3 illustrates that depending on whether the neighboring bit (left bit) is in logic "0" or "1" state the read current of the selected bit (right bit) may slightly vary. This is due to the dual bit's serial channel effect described above. As shown, for the case of the right bit being in a "0" state, the state of the neighboring left bit does not impact the cell current (i.e., 7 µA read current for both "0" and "1" neighboring left bit). However, for the case of the right bit being in "1" state, read currents of 46 µA and 53 µA are obtained for the left bit being in "0" and "1" states, respectively. Thus, in this example, the cell read current is said to be in the range of 46 µA to 53 µA when a bit in the "one" state is being read, and to be 7 µA when a bit in the "zero" state is being read.

Table 4 below shows three different biasing schemes, Read (A), Read (B), and Read (C), in reading the right bit of cell 300. Same three biasing schemes can be reciprocally applied in reading the left bit.

TABLE 4

Various Read Schemes of Right-bit

| | Left junction 305 (Source) | Select-Gate | Right junction 304 (Drain) | Body |
|---|---|---|---|---|
| READ (A) | 2.5 V | 3 V | 0 | 0 |
| READ (B) | 2.5 V | 3 V | 1 V | 0 |
| READ (C) | 2.5 V | 3 V | Vdf (at 1 µA) | 0 |

Read (A) and Read (B) biasing are current sensing schemes, while Read (C) is a voltage sensing scheme. Read (A) scheme is previously discussed. Read (B) scheme is similar to Read (A), except that 1V back-bias is applied to right junction 304. In the voltage sensing Read (C) scheme, 2.5V is applied to left junction 305, 3V is applied to the select-gate, and a voltage Vdf is measured at right junction 304 while 1 µA of current is forced to pass through the cell channel from the left junction 305 to the right junction 304. This is called the "drain follower" voltage sensing technique.

Table 5 below, similar to Table 3, shows the right bit's read current for each of the three Read (A), Read (B), and Read (C) biasing schemes.

TABLE 5

Right-bit Sensing Under Different Sensing Schemes

| Left-bit Possible States: | 0" | 1" | 0" | 1" |
|---|---|---|---|---|
| Right-bit Sensing: | | | | |
| Read (A) Scheme: | 7 µA | 7 µA | 46 µA | 53 µA |
| Read (B) Scheme: | 0 µA | 0 µA | 8 µA | 11 µA |

TABLE 5-continued

Right-bit Sensing Under Different Sensing Schemes

| Left-bit Possible States: | 0" | 1" | 0" | 1" |
|---|---|---|---|---|
| Read (C) Scheme: | 0.5 V | 0.5 V | 1.4 V | 1.4 V |
| When State of Right-bit is: | "0" | | "1" | |

As shown, Read (A) scheme provides the highest cell current (e.g., ranging from 46 µA to 53 µA) for the case of the right bit being in the "one" state, but provides a non-zero read current (e.g., 7 µA) for the case of the right bit being in the "0" state. With a 1V back-bias at right junction 304, Read (B) scheme provides a smaller cell current (e.g., ranging from 8 µA to 11 µA) for the case of the right bit being in the "1" state, but completely cuts off the channel current for the case of the right bit being in the "0" state. In the Read (C) scheme, the right bit's "0" and "1" states are represented by Vdf of 0.5V and 1.4V, respectively (a difference of about 0.9V).

Figure 4A:
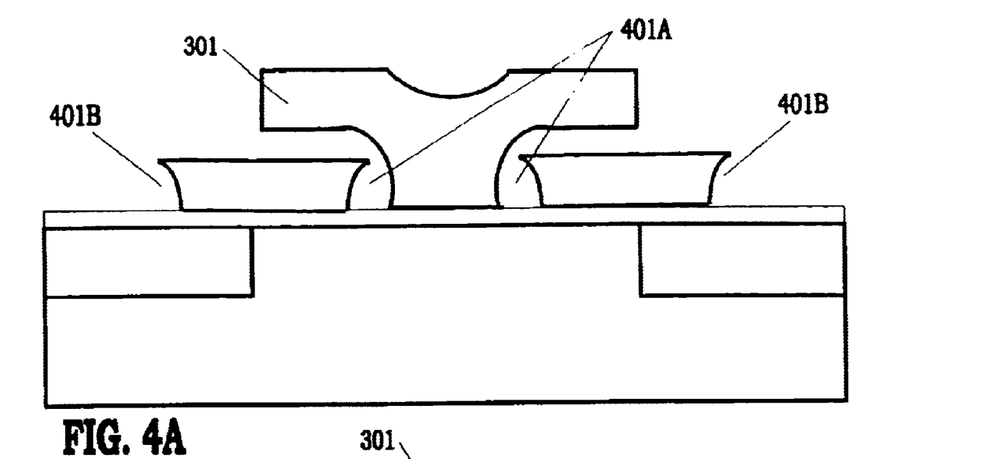
FIGS. 4A–4C are cross-section views of three cell structures, illustrating three different floating gate erase edge shapes.
Figure 4B:
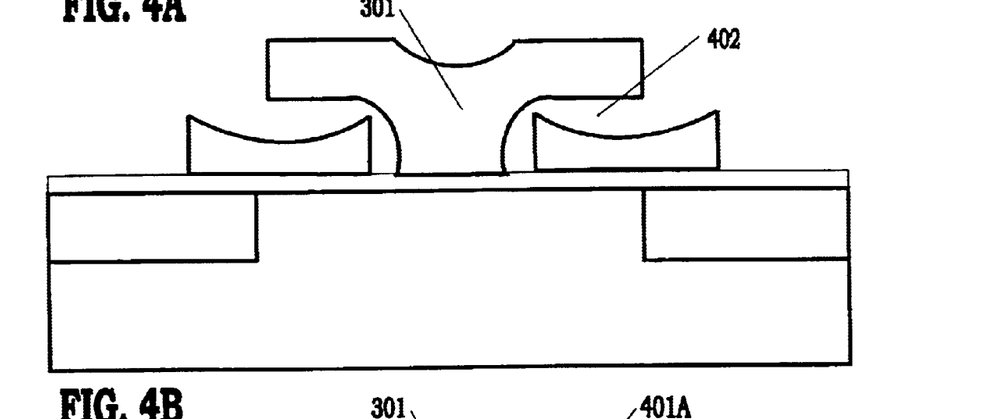
Figure 4C:
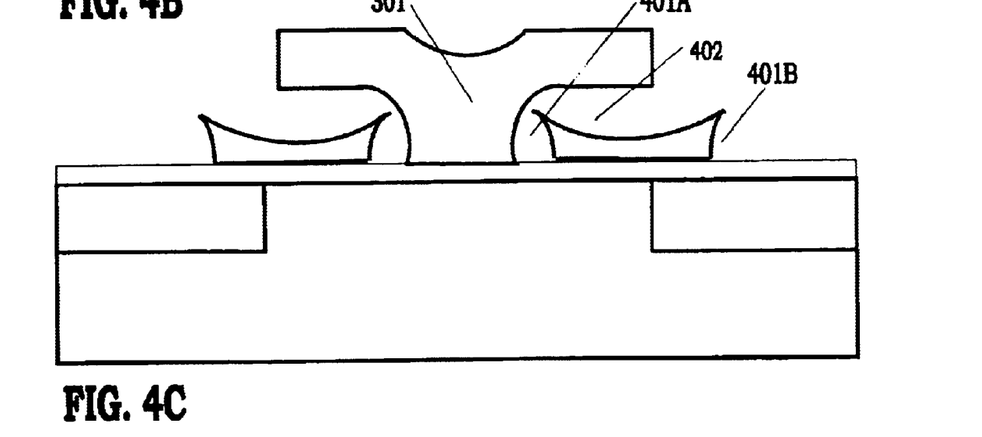

FIGS. 4A–4C are cross-section views of three alternative cell structures with three different floating gate edge shapes. In FIG. 4A, two opposing side surfaces of each of the two floating gates are modified so that each floating gate has two symmetrical sharp edges, one at the top right corner and one at the top left corner. Note that the outer sharp edge of each floating gate has little or no impact on the cell operation, but such symmetry simplifies the process steps required in forming the sharp edges. The symmetrical sharp edges are formed by processing uneven dielectric side wall spacers 401A and 401B on the floating gates' interior and exterior side surfaces so that a sharp and "side way" pointing polysilicon edge appears at the top right and top left corners of the floating gates.

In FIG. 4B, sharp edges of the floating gates are formed by processing the inter-polysilicon dielectric layer 402 between the floating gates' top surface and select-gate 301 so that the top surface of the floating gates is bowl-shaped. By combining the techniques of FIGS. 4A and 4B, much sharper floating gate edges are formed, as depicted in FIG. 4C. In FIG. 4C, the sharp edges are formed by processing uneven dielectric spacers 401A and 401B on the floating gates' interior and exterior side surfaces, and by processing the inter-polysilicon dielectric layer 402 between the floating gates' top surface and select-gate 301.

Note that the required "weak region" in the inter-polysilicon dielectric of the above-mentioned cell embodiments is formed by physically shaping a floating gate edge through process steps. The weak region can also be obtained by other means, for example, by processing the inter-polysilicon dielectric to have localized "controlled damages" (e.g., through masked high-energy particle beams bombardment), or by applying high-voltage across the inter-polysilicon dielectric so that the dielectric is weakened where electrical discharge occurs; or by using anisotropic (or directionally sensitive) dielectric material between the select-gate and the floating gate.

Figure 5A:
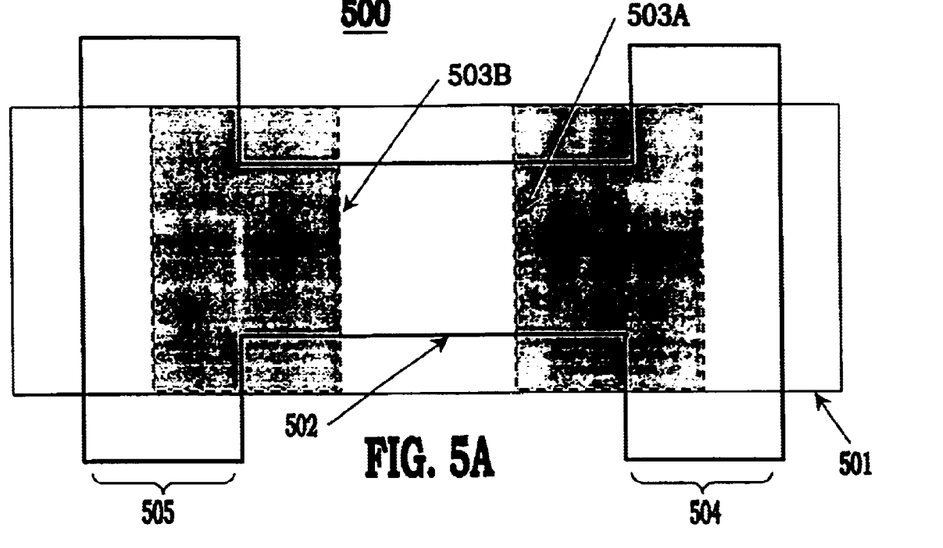
FIGS. 5A and 5B respectively show a layout plan-view and a cross-section view of a dual-bit double-polysilicon cell structure in accordance with an embodiment of the present invention.
Figure 5B:
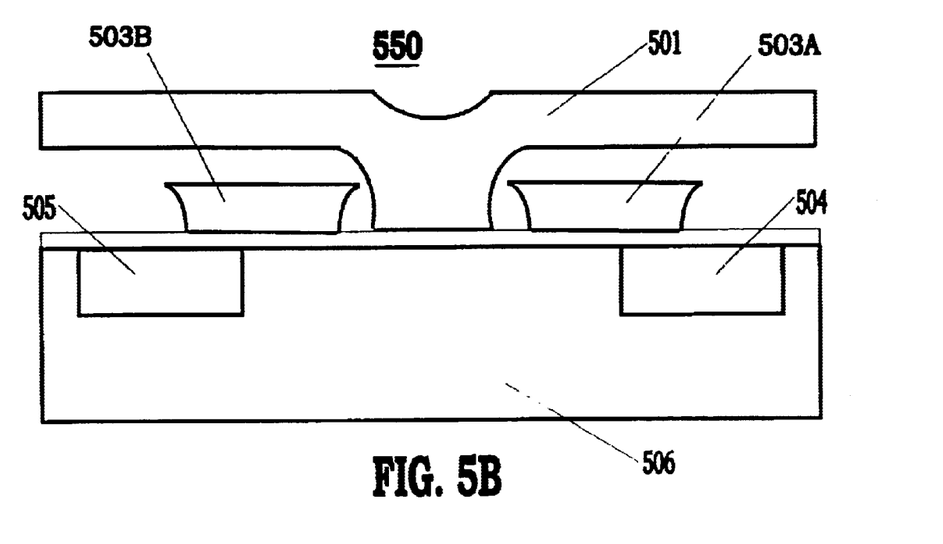

FIGS. 5A and 5B respectively show a layout plan-view 500 and a cross-section view 550 of a dual-bit double-polysilicon cell structure in accordance with an embodiment of the present invention. The cell structure of FIGS. 5A and 5B is most suitable for building a contactless (virtual ground) memory array. Two adjacent floating gates 503A and 503B, from a first polysilicon layer, are formed on top of an H-shaped active region 502. Junctions 505 and 504 form part of the array bitlines which run in parallel along the vertical direction. Junctions 505 and 504 are formed through an n-type implant doping step wherein the outer edge of each of floating gates, 503A, 503B is used as a self-aligned bitline implants masking edge. Select-gate 501 forms an array wordline which runs in the horizontal direction, and is from second polysilicon (or silicide) layer. The cell's body region 506 is the starting p-type silicon substrate.

Alternatively, instead of the starting p-type substrate forming the cell body, an "internal p-well" can form the cell body. This requires a triple-well process in which the internal p-well is formed within a deep n-well. In such structure, the cell's body terminal can be independently biased to a desired potential. This advantageously enables use of lower voltages in operating the cell. For example, in the erase-mode, rather than applying 12V to the select-gate, and grounding the body, source, drain terminals, it is now possible to use bipolar voltages of 7V and negative five volts (−5V) respectively applied to the select-gate terminal and the body, source, and drain terminals. Thus, same erase performance is achieved but the on-chip voltage pumping requirements are relaxed, and thus use of low voltage array decoding circuits is made possible.

Figure 6:
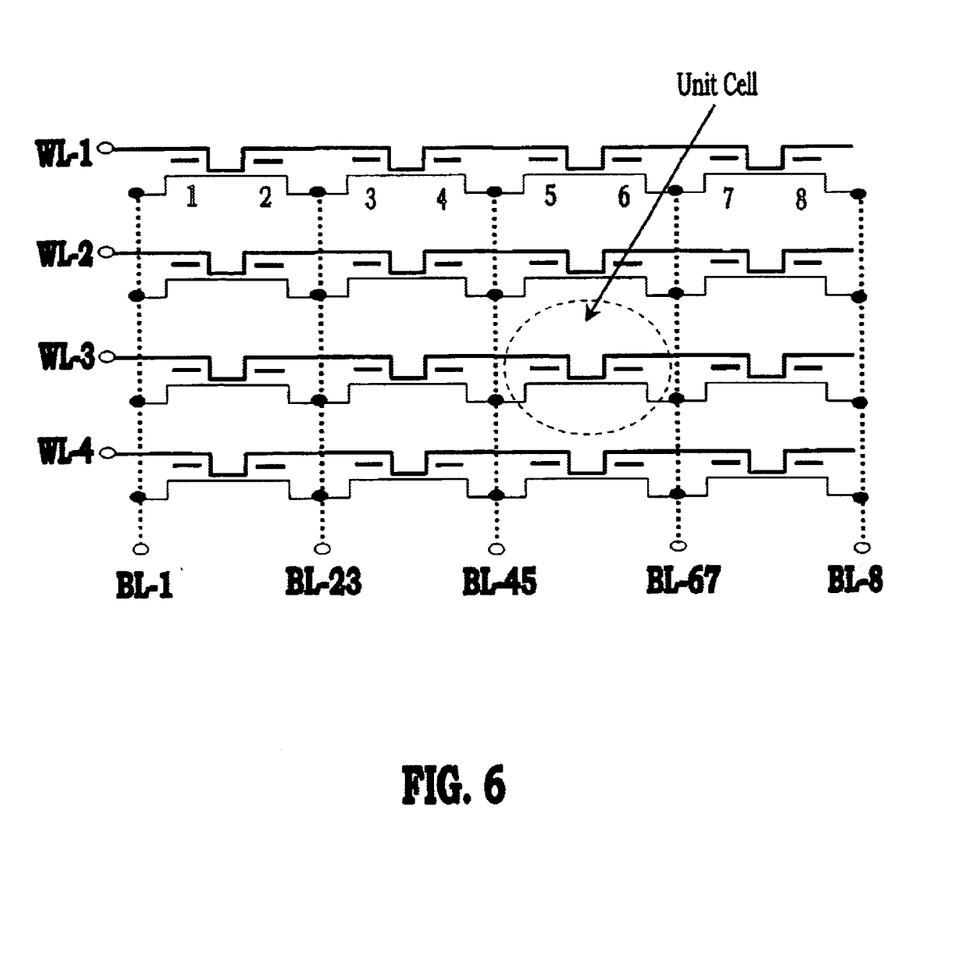
FIG. 6 is a circuit schematic of one example of a contactless memory array constructed from the FIGS. 5A and 5B memory cell.

FIG. 6 shows one possible application of the cell structure depicted in FIGS. 5A and 5B. A circuit schematic of a contactless memory array of 4×4 cells capable of storing 32 bits is shown. The bitlines BL-1, BL-23, BL-45, BL-67, BL-8 are formed by connecting the drain or source junctions together along the vertical direction, and the wordlines WL-1 to WL-4 are formed by linking each of the select-gates along the horizontal direction. The erase, program, and read operations of a cell(s) at a selected address are similar to those described above. For example, during erase, a high voltage (e.g., 12V) is applied to the selected wordline, while the body, the bitlines, and all the unselected wordlines are kept at ground potential. All the cells along the same selected row (which defines an "erase sector") are thus erased simultaneously. In a program cycle, typically, a wordline(s) and a pair of bitlines (a drain bitline and a source bitline) are selected. The selected wordline(s) receives a relatively low voltage (e.g., 1.5V) while the unselected wordlines are set to ground potential. Alternatively, the unselected wordlines can be biased to a negative voltage instead of ground potential. The negative voltage on the unselected wordlines minimizes the drain-to-source channel's subthreshold leakage in the unselected cells along the programming column, and hence improves the cells' program-disturb tolerance.

The above described embodiments are merely illustrative of the present invention. Various design changes in the memory cell and array construction and alterations in terminologies or in the operating conditions (with other voltage combinations, for example) of the cell and array will become apparent to those skilled in the art after learning the above disclosure. It is to be understood that the scope of the invention is not limited merely to the above described embodiments.

What is claimed is:

1. A method of operating a memory cell having first and second junctions in a body region, the first and second junctions being separated by a channel region, the separation between the first and second junctions defining a cell channel length extending horizontally, each of the first and second junctions having a vertically-extending width, a horizontally-extending length, and a depth, the memory cell further having first and second floating gates extending over the channel region, and a select-gate extending over the first and second floating gates and extending across the entire length of each of the first and second junctions, the select gate being separated from the first and second floating gates only by an insulating layer, the method comprising:

storing a first bit of data in the first floating gate;
storing a second bit of data in the second floating gate;
in a first read operation, reading only the first bit of data; and
in a second read operation, reading only the second bit of data.

2. The method of claim 1 wherein said act of reading the first bit of data comprises:

applying a positive voltage to the select gate;
applying a positive voltage to the second junction; and
applying ground potential or a positive voltage or a predesignated current to the first junction.

3. A The method of claim 2 wherein the first floating gate overlaps the first junction and the second floating gate overlaps the second junction.

4. The method of claim 2 wherein said act of reading the second bit of data comprises:

applying a positive voltage to the select gate;
applying a positive voltage to the first junction; and
applying ground potential or a positive voltage or a predesignated current to the second junction.

5. The method of claim 4 wherein:

said act of reading the first bit of data further comprises applying ground potential to the body region, and
said act of reading the second bit of data further comprises applying ground potential to the body region.

6. The method of claim 4 wherein said positive voltage in said acts of applying a positive voltage to the select gate is about 3V, and said positive voltage in said acts of applying a positive voltage to the second junction and applying a positive voltage to the first junction is about 2.5V.

7. The method of claim 4 wherein:

the act of applying ground potential or a positive voltage or a predesignated current to the first junction comprises:
forcing a predetermined amount of current through the channel region; and
measuring the voltage at the first junction, and
the act of applying ground potential or a positive voltage or a predesignated current to the second junction comprises:
forcing a predetermined amount of current through the channel region; and
measuring the voltage at the second junction.

8. The method of claim 1 in combination with other similar cell structures forming a virtual ground array of rows and columns of cells, the cells along each row being serially connected, the select-gates of the cells along each row being connected together forming a plurality of horizontally-extending select-gate lines, the first junction of cells along each column of cells being connected together forming a first plurality of vertically-extending bitlines, and the second junction of the cells along each column of cells being connected together forming a second plurality of vertically-extending bitlines.

9. The method of claim 1 wherein the first floating gate overlaps the first junction and the second floating gate overlaps the second junction, wherein the act of reading the first bit of data comprises:

applying a first voltage to the first junction; and
applying a second voltage to the second junction, the second voltage being greater in magnitude than the first voltage.

10. The method of claim 1 wherein each of the first and second floating gates has at least one slanted surface forming a sharp edge so that insulating layer is thinnest between the sharp edge of each of the two floating gates and the select-gate.

11. The method of claim 10 further comprising:

changing the electrical potential of the first floating gate by biasing the memory cell to induce tunneling of electrons from the first floating gate to the select gate substantially through the sharp edge of the first floating gate; and changing the electrical potential of the second floating gate by biasing the memory cell to induce tunneling of electrons from the second floating gate to the select gate substantially through the sharp edge of the second floating gate.

12. A method of programming a memory cell having a source region and a drain region in a body region, the source and drain regions being separated by a channel region, the separation between the source and drain regions defining a cell channel length extending horizontally, each of the source and drain regions having a vertically-extending width, a horizontally-extending length, and a depth, the memory cell further having a first floating gate extending over a first portion of the channel region and overlapping the drain region, a second floating gate extending over a second portion of the channel region and overlapping the source region, and a select-gate extending over the first and second floating gates and extending across the entire length of each of the source and drain regions, the select gate being separated from the first and second floating gates only by an insulating layer, the method comprising:

changing an electrical potential of the first floating gate by applying a first set of voltages to the select gate, the body region, the drain region, and the source region to induce injection of hot electrons into the first floating gate from the channel region under the source-side of the first floating gate; and changing the electrical potential of the second floating gate by applying a second set of voltages to the select gate, the body region, the drain region, and the source region to induce injection of hot electrons into the second floating gate from the channel region under the drain-side of the second floating gate.

13. The method of claim 12 wherein:

said act of changing an electrical potential of the first floating gate comprises:
applying a positive voltage to each of the select gate and the drain region; and
applying a ground potential to each of the source and body regions, and said act of changing an electrical potential of the second floating gate comprises:
applying a positive voltage to each of the select gate and source region; and
applying a ground potential to each of the drain and body regions.

14. The method of claim 13 wherein:

the positive voltage applied to the drain region is greater than the positive voltage applied to the select gate, and the positive voltage applied to the source region is greater than the positive voltage applied to the select gate.

15. The method of claim 12 wherein:

said act of applying a positive voltage to each of the select gate and the drain region comprises:
applying about 6.5V to the drain region; and
applying about 1.5V to the select gate, and said act of applying a positive voltage to each of the select gate and the source region comprises:
applying about 6.5V to the source region; and
applying about 1.5V to the select gate.

16. The method of claim 12 in combination with other similar cell structures forming a virtual ground array of rows and columns of cells, the cells along each row being serially connected, the select-gates of the cells along each row being connected together forming a plurality of horizontally-extending select-gate lines, the drain region of cells along each column of cells being connected together forming a first plurality of vertically-extending bitlines, and the source region of the cells along each column of cells being connected together forming a second plurality of vertically-extending bitlines.

\* \* \* \* \*